US012804837B2

(12) United States Patent
Zhang

(10) Patent No.: US 12,804,837 B2
(45) Date of Patent: Nov. 17, 2026

(54) BOX AND OUTDOOR ELECTRIC APPLIANCE

(71) Applicant: Suju Zhang, Hong Kong (CN)

(72) Inventor: Suju Zhang, Hong Kong (CN)

( * ) Notice: Subject to any disclaimer, the term of this patent is extended or adjusted under 35 U.S.C. 154(b) by 233 days.

(21) Appl. No.: 18/674,982

(22) Filed: May 27, 2024

(65) Prior Publication Data

US 2025/0151222 A1 May 8, 2025

Related U.S. Application Data

(60) Provisional application No. 63/596,672, filed on Nov. 7, 2023.

(51) Int. Cl.
*H05K 5/06* (2006.01)
*H05K 5/02* (2006.01)

(52) U.S. Cl.
CPC ........... *H05K 5/061* (2013.01); *H05K 5/0208* (2013.01); *H05K 5/069* (2013.01)

(58) Field of Classification Search
None
See application file for complete search history.

(56) References Cited

U.S. PATENT DOCUMENTS 3,544,146 A * 12/1970 Asenbauer ............. B65D 45/18 292/87
3,581,032 A * 5/1971 Christensen ............. H01H 9/22 200/50.15
5,094,358 A * 3/1992 Serio, Sr. ............ E05B 15/0093 292/205
5,118,000 A * 6/1992 Howell ................... B65F 1/122 414/407
5,743,606 A * 4/1998 Scholder ................. F16B 12/26 361/725
9,295,175 B2 * 3/2016 Ichikawa ........... H01R 13/6658
10,622,177 B2 * 4/2020 Roth .................... H01R 9/2608
11,146,211 B1 * 10/2021 Jacob ..................... A01K 47/00
2006/0267463 A1 * 11/2006 Peng ........................ H05K 5/15 312/223.2
2009/0091141 A1 * 4/2009 Kreitzer ................ B65F 1/1615 292/130
2012/0169197 A1 * 7/2012 Jiang ....................... G06F 1/181 312/293.3
2016/0072266 A1 * 3/2016 Bulancea ................. H02G 3/14 174/67
2016/0159570 A1 * 6/2016 Reeb ................... E05B 17/2034 292/197

* cited by examiner

*Primary Examiner* — Krystal Robinson
(74) *Attorney, Agent, or Firm* — HOWARD M COHN and Associates, LLC

(57) ABSTRACT

An example includes a lower box, an upper cover, a sealing ring, and a locking mechanism; the upper cover is rotatably connected with the lower box; the lower box is provided with snapping parts; the sealing ring is arranged on the upper cover; the lower box abuts against the sealing ring when the lower box is covered with the upper cover; the locking mechanism comprises a crossbar which is slidably arranged on the upper cover and provided with hooks; when the lower box is covered with the upper cover and the crossbar slides to a designated locking position; one of the hooks is snap-fitted on one of the snapping parts, and the sealing ring is pressed jointly by the upper cover and the lower box; In this way, the upper cover and the lower box are sealed in place to form a sealed box.

8 Claims, 6 Drawing Sheets

BOX AND OUTDOOR ELECTRIC APPLIANCE

CROSS-REFERENCE TO RELATED APPLICATIONS

This application is based upon and claims priority to U.S. Provisional Application No. 63/596,672, filed on Nov. 7, 2023, the entire contents of which are incorporated herein by reference.

TECHNICAL FIELD

The present disclosure relates to the technical field of boxes, specifically to a unique box and an outdoor electric appliance.

BACKGROUND

In response to the common issue of waterproofing, this disclosure presents a solution for electrical appliances designed for outdoor use. These appliances are typically housed in enclosures consisting of a lower box, an upper cover, a sealing element, and multiple bolts. One side of the upper cover is pivotally attached to the lower box, while the sealing element is positioned between the upper cover and the lower box. The upper cover is secured to the lower box with several bolts, compressing the sealing element to create a waterproof seal.

SUMMARY

Example embodiments of the present disclosure disclose a box, which comprises a lower box, an upper cover, a sealing ring, and a locking mechanism, wherein one side of the upper cover is rotatably connected with one side of the lower box, the other side of the lower box is provided with multiple snapping parts; a sealing ring is arranged on the upper cover, the lower box abuts against the sealing ring when the lower box is covered with the upper cover; the locking mechanism comprises a crossbar which is slidably arranged on the upper cover and provided with multiple hooks; when the lower box is covered with the upper cover and the crossbar slides to a designated locking position, one of the hooks is snap-fitted on one of the snapping parts, and the sealing ring is pressed jointly by the upper cover and the lower box; and when the crossbar slides to a designated unlocking position, the hook is detached from the snapping part.

Example embodiments of this disclosure present a box comprising a lower box, an upper cover, a sealing ring, and a locking mechanism. One side of the upper cover is rotatably connected to one side of the lower box, while the other side of the lower box multiple features multiple snapping parts. A sealing ring is installed on the upper cover, which contacts the lower box when the lower box is covered with the upper cover. The locking mechanism includes a crossbar, which is slidably mounted on the upper cover and equipped with multiple multiple hooks. When the upper cover covers the lower box and the crossbar slides to a designated locking position, one of the hooks is snap-fitted on one of the snapping parts, causing the upper cover and lower box to compress the sealing ring jointly. Conversely, the hook disengages from the snapping part when the crossbar slides to a designated unlocking position.

BRIEF DESCRIPTION OF THE DRAWINGS

The figures of the accompanying drawings illustrate one or more embodiments by way of example, not by limitation, wherein elements having the same reference numeral designations represent like elements throughout. The drawings are not to scale unless otherwise disclosed.

DESCRIPTION OF REFERENCE NUMERALS

Figure 1:
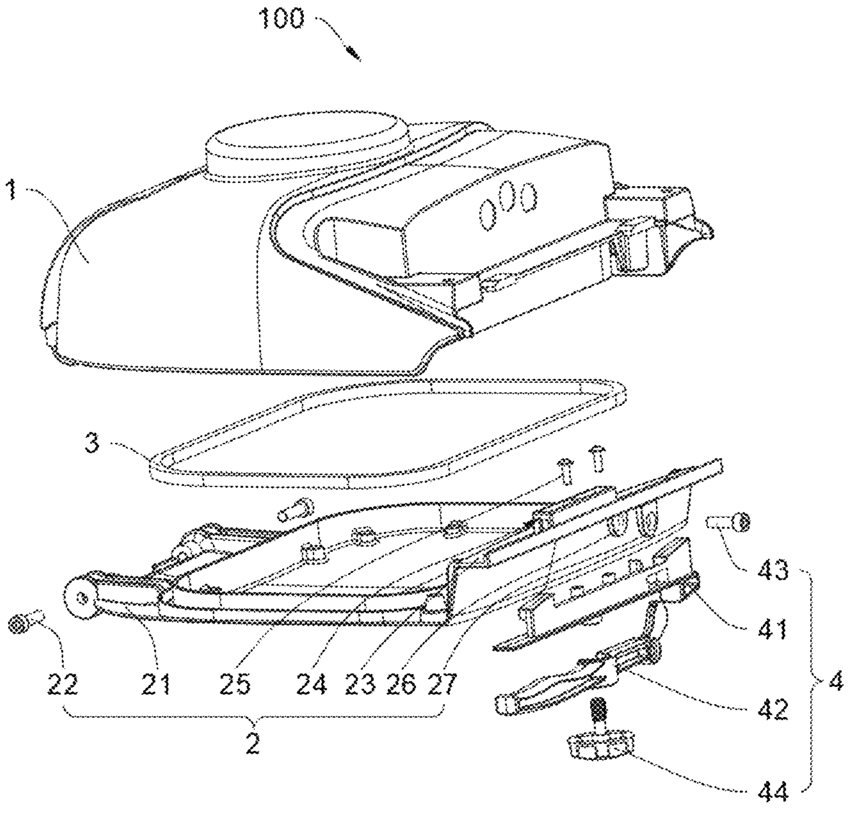
FIG. 1 is a schematic exploded diagram illustrating the structure of a box provided according to an embodiment of the present disclosure.
Figure 2:
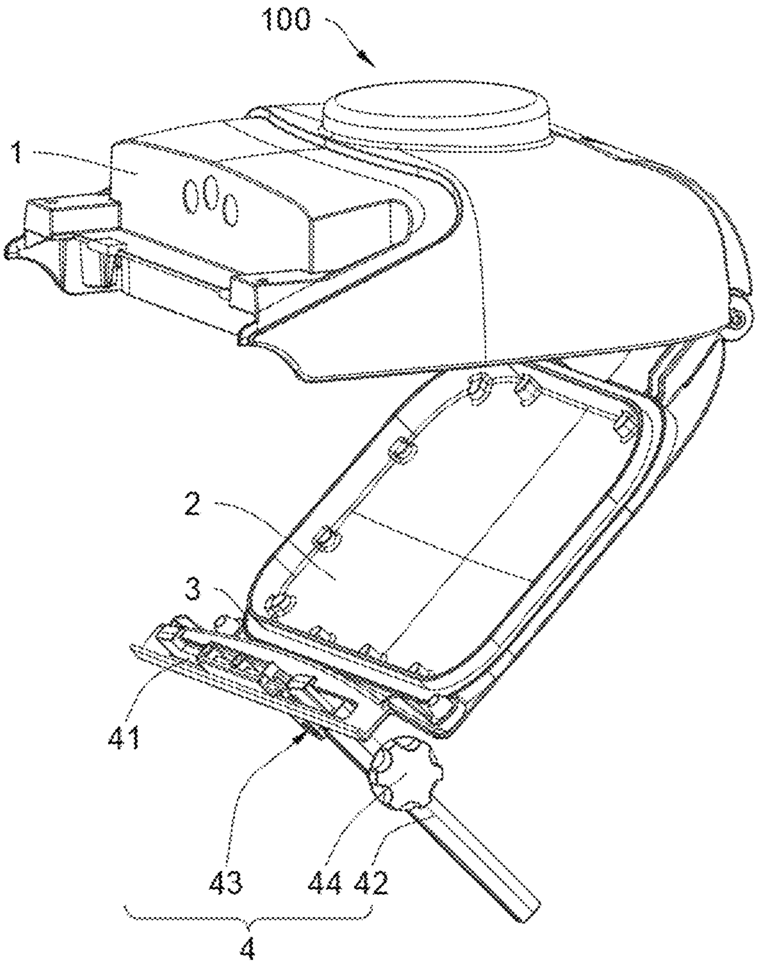
FIG. 2 is a schematic structural diagram of the box in the open state provided according to the embodiment of the present disclosure.
Figure 3:
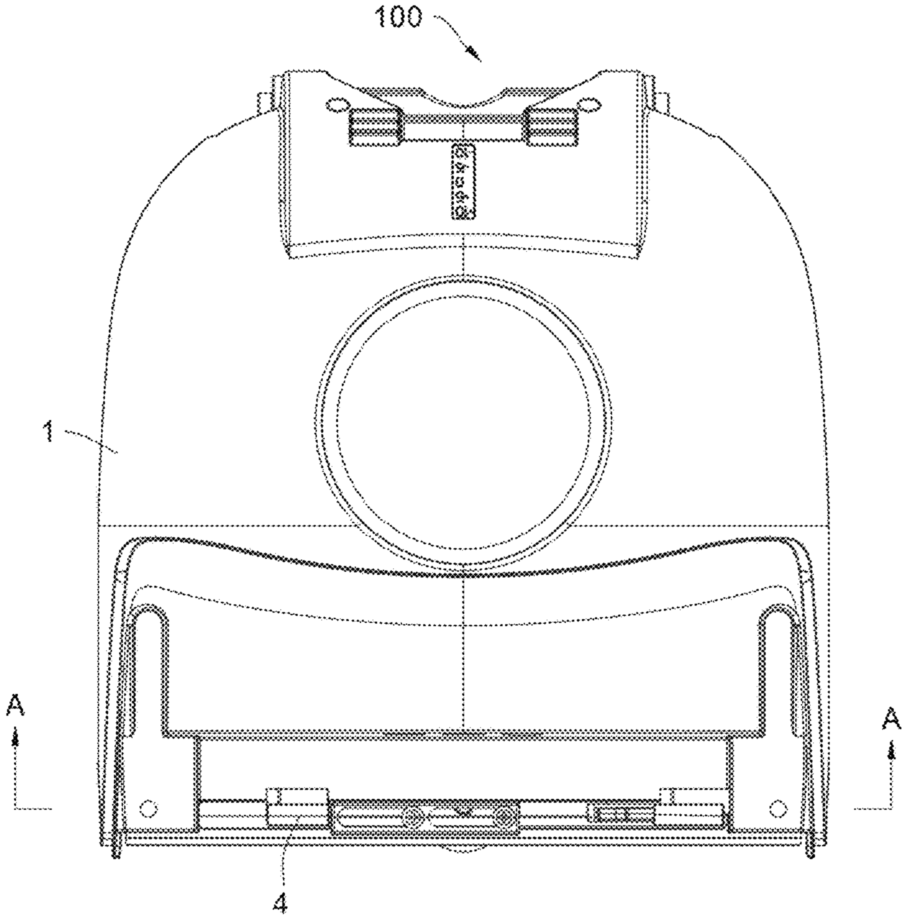
FIG. 3 is a schematic top view illustrating the box structure provided according to the embodiment of the present disclosure.
Figure 4:
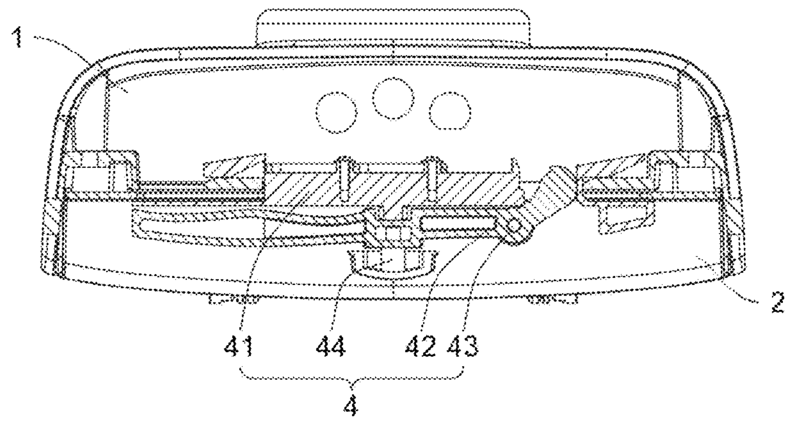
FIG. 4 is a schematic cross-sectional view illustrating the structure taken at A-A of FIG. 3.

100: Box;

1: Lower box; 11: Accommodating groove; 12: Connecting part; 121: Limiting groove; 13: Second via; 14: Snapping part; 141: Second guide plane; 142: Second abutting plane;

2: Upper cover; 21: Cover; 211: Rotating groove; 212: Third via; 213: Third screw hole; 214: Limiting part; 215: Annular groove; 22: Third bolt; 23: L-shaped part; 231: Sliding hole; 24: Fixing part; 241: Avoidance through groove; 242: Strip-shaped hole; 25: First bolt; 26: First connecting sheet; 261: Fourth screw hole; 27: Second connecting sheet; 271: Fourth via; 3: Sealing ring;

4: Locking mechanism; 41: Crossbar; 411: Sheet part; 412: Insertion part; 4121: First screw hole; 413: Hook; 4131: First guide plane; 4132: First abutting plane; 414: Connecting post; 4141: Second screw hole; 415: Pushing slot; 416: Abutting part; 42: Lever; 421: Rotating part; 4211: Fifth via; 4212: First via; 422: Pushing part; 4221: Limiting hook; 423: Gripping part; 43: Fourth bolt; 44: Second bolt.

DETAILED DESCRIPTION

It will be elaborated upon in greater detail regarding the accompanying drawings and specific embodiments to enhance understanding of this disclosure. It should be noted that when an element is described as being "fixed" to another element, it may be directly on the other element or may have one or more intervening elements in between. Similarly, when an element is described as being "connected" to another element, it may be directly connected or have one or more intervening elements. Terms such as "vertical," "horizontal," "left," "right," and similar expressions are used in this specification solely for illustrative purposes.

Unless otherwise defined, all technical and scientific terms used in this specification have the same meaning as commonly understood by those skilled in the art to which the present disclosure belongs. The terms used in the specification of the present disclosure are only to describe specific embodiments and are not intended to limit the present disclosure. The term "and/or," as used in this specification, comprises any and all combinations of one or more associated items listed.

Referring to FIG. 1 to FIG. 4, box 100 comprises a lower box 1, an upper cover 2, a sealing ring 3, and a locking mechanism 4. One side of the upper cover 2 is rotatably connected with one side of the lower box 1, and the upper cover 2 is used for closing or opening the lower box 1. The sealing ring 3 is arranged on the upper cover 2, and when the lower box 1 is covered with the upper cover 2, the lower box 1 abuts against the sealing ring 3. The locking mechanism 4 is arranged on the upper cover 2, and when the lower box 1 is covered with the upper cover 2 and a part of the locking mechanism 4 slides to a designated locking position, the part of the locking mechanism 4 is locked with the other side of the lower box 1. The upper cover 2 and the lower box 1 jointly press the sealing ring 3 so that the upper cover 2 and the lower box 1 are sealed in place to form a sealed box 100. In this way, the waterproof function of the box 100 is realized, and the risk of water ingress caused by insufficient sealing is avoided. When the upper cover 2 and the lower box 1 jointly press the sealing ring 3, the box 100 is formed into a sealed box 100, and the box 100 is the body of a waterproof chamber, while the upper cover 2 is the cover of the waterproof chamber.

Figure 5:
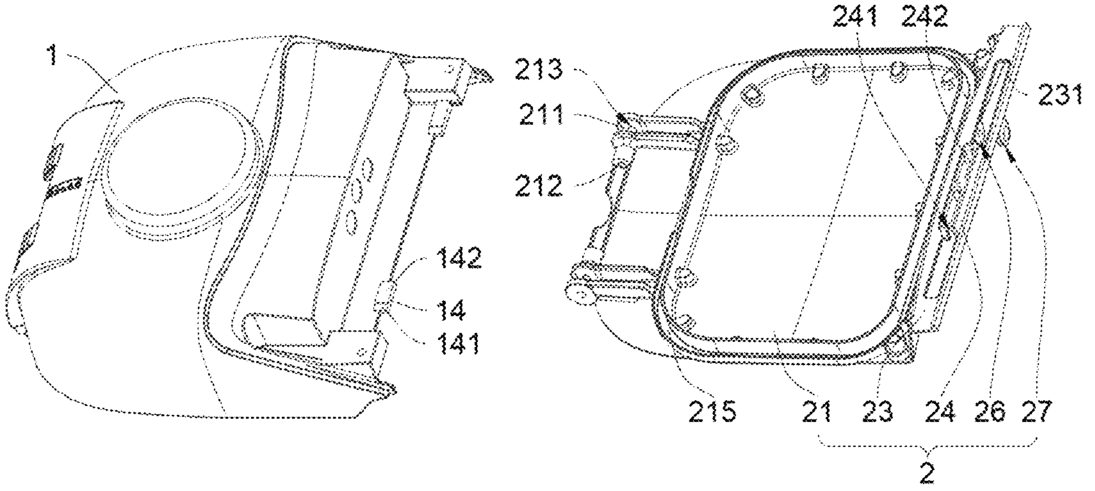
FIG. 5 is a schematic exploded view illustrating partial structures of a lower box and an upper cover of the box provided according to the embodiment of the present disclosure.
Figure 6:
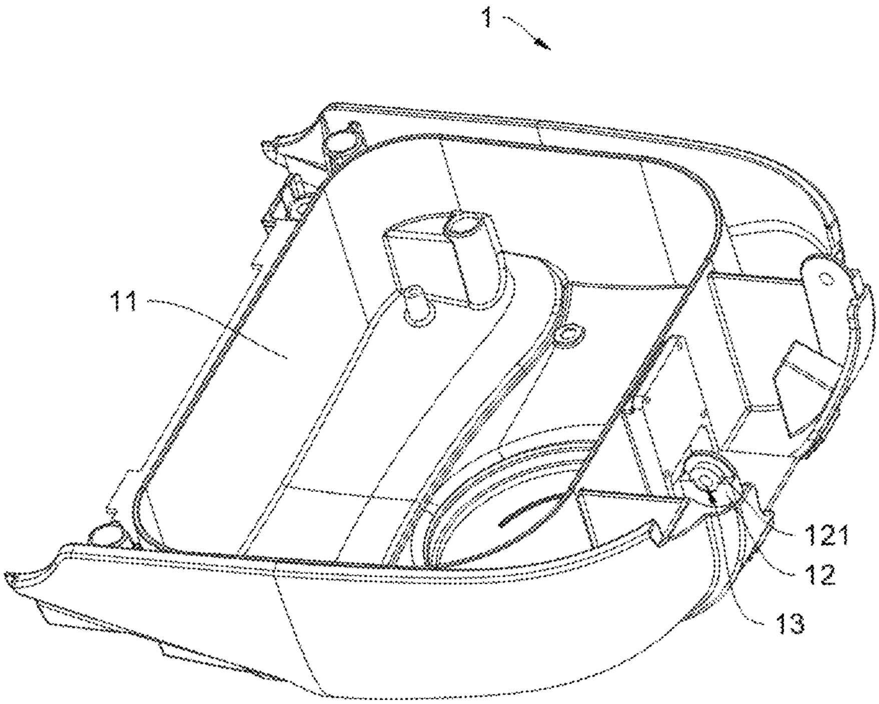
FIG. 6 is a schematic structural diagram of the box's lower box provided according to the embodiment of the present disclosure.

Referring to FIG. 5 and FIG. 6, the lower box 1 described above has an accommodating groove 11, a connecting part 12, a second via 13, and multiple snapping parts 14. The accommodating groove 11 is used to accommodate other components of outdoor electric appliances, such as LED bulbs, control panels, and the like. The connecting part 12 is arranged at one side of the lower box 1 and is provided with a limiting groove 121, and part of the upper cover 2 is rotatably inserted into the limiting groove 121 to limit the rotation of the upper cover 2. The second via 13 is arranged on the connecting part 12 for part of the upper cover 2 to pass through. The plurality of snapping parts 14 are arranged on the other side of the lower box 1 at intervals, and the snapping parts 14 are provided with a second guide plane 141 and a second abutting plane 142. The second guide plane 141, is connected with the second abutting plane 142, and the second guide plane 141, is obliquely arranged so that the snapping part 14 is formed into a first bayonet position guided by a first bevel position. The second guide plane 141, is used to guide the locking mechanism 4, and the second abutting plane is used for abutting against the locking mechanism 4.

Figure 7:
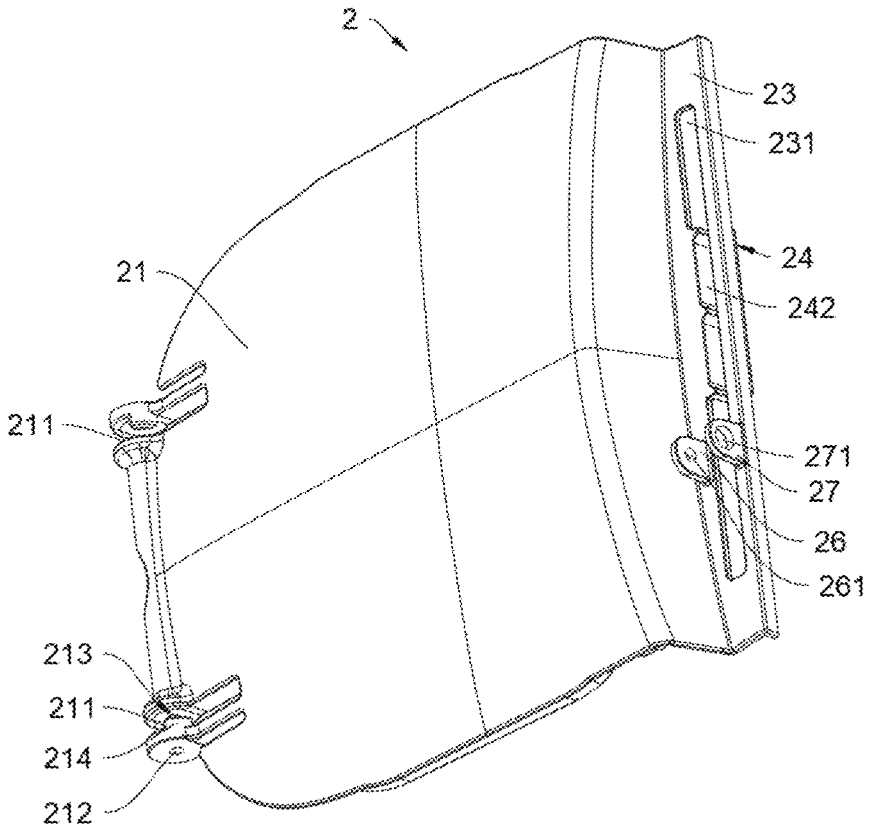
FIG. 7 is a schematic structural diagram illustrating part of the upper cover of the box provided according to the embodiment of the present disclosure.
Figure 8:
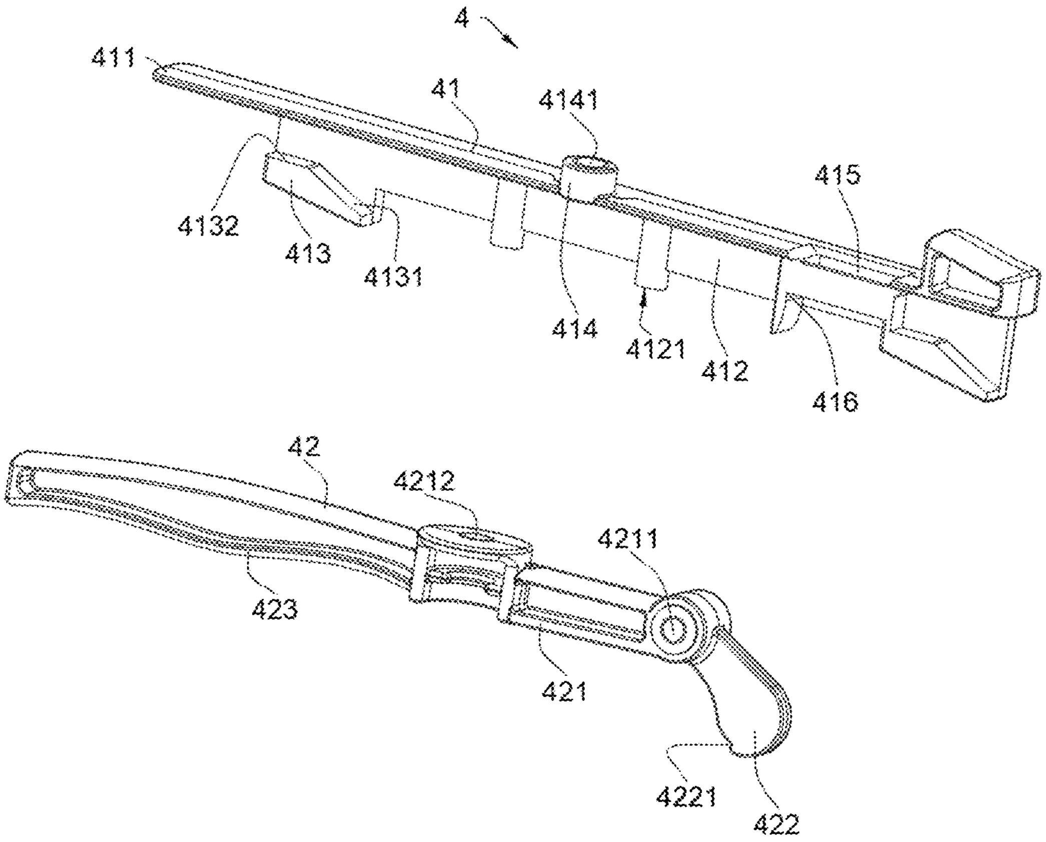
FIG. 8 is a schematic exploded diagram illustrating the structure of a crossbar and a lever of a locking mechanism provided according to the embodiment of the present disclosure.

Referring to FIG. 1, FIG. 5, and FIG. 7, the upper cover 2 described above comprises a cover 21, a third bolt 22, an L-shaped part 23, a fixing part 24, a first bolt 25, a first connecting sheet 26, and a second connecting sheet 27.

The cover 21 is provided with a rotating groove 211, a third via 212, a third screw hole 213, a limiting part 214, and an annular groove 215. The rotating groove 211 is arranged at one side of the cover 21, and the connecting part 12 is inserted into the rotating groove 211. Both the third via 212 and the third screw hole 213 are arranged at one side of the cover 21 and are communicated with the rotating groove 211, and the central axis of the third via 212 is collinear with the central axis of the third screw hole 213. The limiting part 214 is fixed on the side wall of the rotating groove 211 and inserted into the limiting groove 121. The limiting part 214 may rotate relative to the limiting groove 121, and the side wall of the limiting groove 121 may abut against and limit the movement of the limiting part 214 so as to prevent the cover 21 from colliding with the lower box 1 when rotating. The annular groove 215 receives and fixes the scaling ring 3. The third bolt 22, passes through the second via 13 and the third via 212 and then is screwed to the third screw hole 213. The cover 21 may rotate relative to the third bolt 22 so that one side of cover 21 is rotatably connected to one side of the lower box 1, and thus, the accommodating groove 11 can be covered or opened by the cover 21.

The L-shaped part 23 is fixed on the other side of the cover 21 and is provided with a sliding hole 231. The sliding hole 231 is strip-shaped for part of the locking mechanism 4 to pass through, and part of the locking mechanism 4 may slide relative to the sliding hole 231. The fixing part 24 is fixed to the L-shaped part 23, and the fixing part 24 is provided with an avoidance through groove 241 and a strip-shaped hole 242. The avoidance through groove 241 is communicated with the sliding hole 231 and penetrates through the fixing part 24 along the sliding direction of part of the locking mechanism 4. The avoidance through groove 241 accommodates part of the locking mechanism 4. The strip-shaped hole 242 is communicated with the avoidance through groove 241.

The first bolt 25, is screwed to the locking mechanism 4 after passing through the strip-shaped hole 242. The first bolt 25 may slide along the strip-shaped hole 242, and the periphery of the first bolt 25 protrudes from the strip-shaped hole 242 to connect the locking mechanism 4 with the fixing part 24.

The first connecting sheet 26 and the second connecting sheet 27 are fixed to the L-shaped part 23. The first connecting sheet 26 is provided with a fourth screw hole 261, the second connecting sheet 27 is provided with a fourth via 271, the central axis of the fourth via 271 is collinear with the central axis of the fourth screw hole 261, the fourth via 271 is used for part of the locking mechanism 4 to pass through, and the fourth screw hole 261 is used for the threaded connection of part of the locking mechanism 4.

Referring to FIG. 1, the sealing ring 3 described above is fixed in the annular groove 215, and when the lower box 1 is covered with the upper cover 2, the upper cover 2 and the lower box 1 are pressed and sealed together so that the box 100 is formed into a sealed box 100, thereby realizing the waterproof function of the box 100.

Referring to FIG. 1 to FIG. 4 and FIG. 8, the locking mechanism 4 described above comprises a crossbar 41, a lever 42, a fourth bolt 43, and a second bolt 44.

The crossbar 41 is straight line-shaped and is slidably arranged in the sliding hole 231, and the crossbar 41 may slide linearly along the sliding hole 231. The crossbar 41 comprises a sheet part 411, an insertion part 412, multiple hooks 413, and a connecting post 414. The insertion part 412 is fixed on the surface of the sheet part 411 and passes through the sliding hole 231. Part of the insertion part 412 is accommodated in the avoidance through groove 241 so that the avoidance through groove 241 penetrates through the fixing part 24 in the sliding direction of the crossbar 41. Moreover, the insertion part 412 may slide along the sliding hole 231 and the avoidance through groove 241 so that the crossbar 41 is slidably arranged in the sliding hole 231 and the avoidance through groove 241. The insertion part 412 is provided with a first screw hole 4121 for threaded connection of the first bolt 25 so that the insertion part 412 is connected with the fixing part 24. The plurality of hooks 413 are arranged on the insertion part 412 at intervals, and the hooks 413 are provided with a first guide plane 4131 and a first abutting plane 4132. The first guide plane 4131 is connected with the first abutting plane 4132, and the first guide plane 4131 is arranged obliquely to the sheet part 411 so that the hook 413 is formed into a second bayonet position guided by a second bevel position. The first abutting plane 4132 is parallel to the sheet part 411. When the crossbar 41 moves from the designated unlocking position to the designated locking position, the first guide plane 4131 and the second guide plane 141 are configured to guide the first abutting plane 4132 to slide onto the second abutting plane 142 so that the first abutting plane 4132 abuts against the second abutting plane 142 along the direction perpendicular to the sliding of the crossbar 41, and the crossbar 41 slides to the designated locking position. The connecting post 414 is fixed to the sheet part 411 and is provided with a second screw hole 4141 for threaded connection of the second bolt 44. One end of the crossbar 41 is provided with a pushing slot 415, and the pushing slot 415 penetrates through the sheet part 411 and the insertion part 412. The first side wall of the pushing slot 415 is provided with an abutting part 416, and the pushing part 422 is used for abutting against part of the lever 42.

In some embodiments, the crossbar 41 may be arc-shaped and slides along the circular arc of the sliding hole 231.

The lever 42 has a rotating part 421, a pushing part 422, and a gripping part 423. The rotating part 421 is arranged at one end of the lever 42, one end of the rotating part 421 is arranged between the first connecting sheet 26 and the second connecting sheet 27, and the rotating part 421 is provided with a fifth via 4211 and a first via 4212. The fifth via 4211 is arranged at one end of the rotating part 421 for the fourth bolt 43 to pass through. The first via 4212 is arranged at the other end of the rotating part 421 for the second bolt 44 to pass through. The pushing part 422 is connected to one end of the rotating part 421 and is inserted into the pushing slot 415. The pushing part 422 may rotate relative to the pushing slot 415, and the pushing part 422 is configured to actuate the crossbar 41 to move between the designated locking position and the designated unlocking position relative to the upper cover 2. The pushing part 422 is provided with a limiting hook 4221. When the crossbar 41 is in the designated unlocking position, the limiting hook 4221 abuts against the abutting part 416 to limit the movement of the pushing part 422 to prevent the pushing part 422 from continuing to rotate, thereby preventing the lever 42 from colliding with the sheet portion 411. The gripping part 423 is connected to the other end of the rotating part 421 so that the gripping part 423 is arranged at the other end of the lever 42. The gripping part 423 is arc-shaped, so the shape of the gripping part 423 conforms to ergonomics; thus, it is convenient for users to grip and use the lever 42.

The fourth bolt 43, passes through the fifth via 4211 and the fourth via 271 and then is screwed to the fourth screw hole 261. The rotating part 421 may rotate relative to the fourth bolt 43 so that the rotating part 421 is rotatably connected to the first connecting sheet 26 and the second connecting sheet 27. Then, one end of the lever 42 is rotatably connected to the crossbar 41. When the user holds the gripping part 423 to push the lever 42 to rotate relative to the upper cover 2 and the lever 42 actuates the crossbar 41 to move from the designated locking position to the designated unlocking position, the pushing part 422 pushes the first side wall of the pushing slot 415 and pushes the crossbar 41 to slide relative to the sliding hole 231, so that the first abutting plane 4132 is separated from the second abutting plane 142. Then, the upper cover 2 is unlocked from the lower box 1. When the user holds the gripping part 423 to push the lever 42 to rotate relative to the upper cover 2 and the lever 42 actuates the crossbar 41 to move from the designated unlocking position to the designated locking position, the pushing part 422 pushes the second side wall of the pushing slot 415 and pushes the crossbar 41 to slide relative to the sliding hole 231, so that the first abutting plane 4132 abuts against the second abutting plane 142. Then, the upper cover 2 is locked with the lower box 1. Furthermore, by driving the pushing part 422 to rotate through the gripping part 423, it is convenient and labor-saving to drive the crossbar 41 to slide along the sliding hole 231.

When the crossbar 41 is in the designated locking position, the second bolt 44 passes through the first via 4212 and then is screwed to the second screw hole 4141 to fixedly connect the lever 42 with the crossbar 41 and prevent lever 42 from swinging freely. When the crossbar 41 is switched from the designated locking position to the unlocking position, the user unscrews the second bolt 44 by hand so that the second bolt 44 is detached from the second screw hole 4141. Then, the lever 42 may be separated from the crossbar 41.

As shall be appreciated, in some embodiments, the locking mechanism 4 and the first connecting sheet 26 are not limited to the structures mentioned above, and other structures may also be adopted for the locking mechanism 4 and the first connecting sheet 26. For example, the locking mechanism 4 comprises a rotating shaft. The first connecting sheet 26 is provided with a sixth via, and the central axis of the sixth via is collinear with the central axis of the fourth via 271. The rotating shaft is inserted into the fourth via 271, the fifth via 4211, and the sixth via and is in interference connection with the fourth via 271 and the fifth via 4211 or the sixth via so that the lever 42 can rotate relative to the upper cover 2.

As it shall be appreciated, in some embodiments, the structure of the locking mechanism 4 is not limited to the structure mentioned above, and other structures may also be adopted for locking mechanism 4. For example, the locking mechanism 4 comprises a snapping block, the middle part of which is connected to one end of the gripping part 423, which is far away from the rotating part 421. When the crossbar 41 is in the designated unlocking position, one end of the snapping block is snap-fitted on the sheet part 411 to connect the lever 42 with the crossbar 41 fixedly. When the crossbar 41 is switched from the designated locking position to the unlocking position, the user presses the other end of the snapping block to separate the snapping block from the sheet part 411 so that lever 42 can be separated from the crossbar 41. Furthermore, in some embodiments, the L-shaped part 23 is provided with a fixing block. When the crossbar 41 is in the designated unlocking position, one end of the snapping block is snap-fitted on the fixing block to connect the lever 42 with the L-shaped part 23 fixedly. When the crossbar 41 is switched from the designated locking position to the unlocking position, the user presses the other end of the snapping block to separate the snapping block from the fixed block so that the lever 42 can be separated from the upper cover 2.

In the embodiment of the present disclosure, the box 100 comprises a lower box 1, an upper cover 2, a sealing ring 3, and a locking mechanism 4. One side of the upper cover 2 is rotatably connected with one side of the lower box 1, and the other side of the lower box 1 is provided with multiple snapping parts 14. The sealing ring 3 is arranged on the upper cover 2, and when the lower box 1 is covered with the upper cover 2, the lower box 1 abuts against the sealing ring

3. The locking mechanism 4 comprises a crossbar 41, which is slidably arranged on the upper cover 2, and the crossbar 41 is provided with multiple hooks 413. When the lower box 1 is covered with the upper cover 2, and the crossbar 41 slides to the designated locking position, one of the hooks 413 is snap-fitted on one of the snapping parts 14, and the upper cover 2 and the lower box 1 jointly press the sealing ring 3. When the crossbar 41 slides to the designated unlocking position, the hook 413 is separated from the snapping part 14. The crossbar 41 is slidably arranged on the upper cover 2 so that the hooks 413 of the crossbar 41 are snap-fitted on or detached from the snapping parts 14 of the lower box 1. The upper cover 2 is locked with the lower box 1 to press the sealing ring 3, or the upper cover 2 is separated from the lower box 1. In this way, the upper cover 2 and the lower box 1 are sealed in place to form the sealed box 100, thereby avoiding the risk of water ingress caused by insufficient sealing. Furthermore, the upper cover 2 and the lower box 1 are locked or unlocked through the sliding of the crossbar 41, and thus the operation is convenient.

The present disclosure further provides an embodiment of an outdoor electrical appliance comprising box 100, as described above. Reference may be made to the above embodiments for the structure and function of the box 100, which will not be further described herein.

In some embodiments, the outdoor electric appliance may be an outdoor lamp.

It shall be noted that the specification and attached drawings of the present disclosure provide preferred embodiments of the present disclosure. However, the present disclosure may be realized in many different forms and thus is not limited to the embodiments described in this specification. These embodiments are not used as additional restrictions on the contents of the present disclosure, and these embodiments are only provided to make the disclosure more thorough and comprehensive. Moreover, the above technical features continue to be combined to form various embodiments not listed above, which are all regarded as within the scope recorded in the specification of the present disclosure. Further speaking, improvements or changes can be made by those of ordinary skill in the art according to the above description, and all these improvements and changes shall fall within the scope claimed in the appended claims.

The invention claimed is:

1. A box, comprising:

a lower box;

an upper cover, one side of the upper cover being rotatably connected with one side of the lower box, the other side of the lower box being provided with multiple snapping parts;

a sealing ring being arranged on the upper cover, the lower box abutting against the sealing ring when the lower box is covered with the upper cover; and a locking mechanism comprising a crossbar which is slidably arranged on the upper cover and provided with multiple hooks;

when the lower box is covered with the upper cover and the crossbar slides to a designated locking position, one of the hooks is snap-fitted on one of the snapping parts, and the sealing ring is pressed jointly by the upper cover and the lower box;

when the crossbar slides to a designated unlocking position, the hook is detached from the snapping part;

wherein the locking mechanism further comprises a lever, wherein the lever is rotatably connected to the upper cover, and one end of the lever is connected to the crossbar;

when the lever is rotated under the action of an external force, the crossbar may be driven by the lever to move between a designated locking position and a designated unlocking position relative to the upper cover;

wherein one end of the crossbar is provided with a pushing slot, one end of the lever is provided with a pushing part, and the pushing part is inserted into the pushing slot;

when the lever actuates the crossbar to move from the designated locking position to the designated unlocking position, the pushing part pushes a first side wall of the pushing slot; and when the lever actuates the crossbar to move from the designated unlocking position to the designated locking position, the pushing part pushes a second side wall of the pushing slot.

2. The box according to claim 1, wherein the other end of the lever is provided with an arc-shaped gripping part.

3. The box according to claim 1, wherein the upper cover comprises a cover and an L-shaped part, one side of the cover being rotatably connected with one side of the lower box, the L-shaped part being fixed on the other side of the cover, the sealing ring being fixed on the cover, and the L-shaped part being provided with a sliding hole;

wherein the crossbar comprises a sheet part and an insertion part;

wherein the insertion part is fixed on the surface of the sheet part, the insertion part passes through the sliding hole and is slidable along the sliding hole, the plurality of hooks are sequentially arranged on the insertion part at intervals, and the pushing slot penetrates through the sheet part and the insertion part.

4. The box according to claim 3, wherein the hook is provided with a first guide plane and a first abutting plane, the first guide plane is connected with the first abutting plane and is arranged obliquely relative to the sheet part, the first abutting plane is parallel to the sheet part;

when the crossbar moves from the designated unlocking position to the designated locking position, the first guide plane is configured to guide the first abutting plane to slide onto the snapping part, so that the first abutting plane abuts against the snapping part along the direction perpendicular to the sliding of the crossbar and the crossbar slides to the designated locking position.

5. The box according to claim 4, wherein the snapping part is provided with a second guide plane and a second abutting plane, the second guide plane is connected with the second abutting plane and is obliquely arranged;

when the crossbar moves from the designated unlocking position to the designated locking position, the second guide plane is configured to guide the first abutting plane to slide onto the second abutting plane, so that the first abutting plane abuts against the second abutting plane along the direction perpendicular to the sliding of the crossbar and the crossbar slides to the designated locking position.

6. The box according to claim 3, wherein the upper cover further comprises a fixing part, the fixing part is fixed to the L-shaped part and is provided with an avoidance through groove;

wherein the avoidance through groove penetrates through the fixing part along the sliding direction of the crossbar and is used for accommodating the insertion part;

wherein the fixing part is further provided with a strip-shaped hole which is in communication with the avoidance through groove, and the insertion part is provided with a first screw hole;

wherein the upper cover further comprises a first bolt which is screwed to the first screw hole after passing through the strip-shaped hole, and the periphery of the first bolt protrudes from the strip-shaped hole.

7. The box according to claim 6, wherein the locking mechanism further comprises a second bolt, the lever is provided with a first via, and the crossbar is provided with a second screw hole;

when the crossbar is in the designated locking position, the second bolt passes through the first via and then is screwed to the second screw hole.

8. An outdoor electric appliance, comprising a box, wherein the box comprises:

a lower box;

an upper cover, one side of the upper cover being rotatably connected with one side of the lower box, the other side of the lower box being provided with multiple snapping parts;

a sealing ring being arranged on the upper cover, the lower box abutting against the sealing ring when the lower box is covered with the upper cover; and a locking mechanism comprising a crossbar which is slidably arranged on the upper cover and provided with multiple hooks;

when the lower box is covered with the upper cover and the crossbar slides to a designated locking position, one of the hooks is snap-fitted on one of the snapping parts, and the sealing ring is pressed jointly by the upper cover and the lower box;

when the crossbar slides to a designated unlocking position, the hook is detached from the snapping part;

wherein the locking mechanism further comprises a lever, wherein the lever is rotatably connected to the upper cover, and one end of the lever is connected to the crossbar;

when the lever is rotated under the action of an external force, the crossbar may be driven by the lever to move between a designated locking position and a designated unlocking position relative to the upper cover;

wherein one end of the crossbar is provided with a pushing slot, one end of the lever is provided with a pushing part, and the pushing part is inserted into the pushing slot;

when the lever actuates the crossbar to move from the designated locking position to the designated unlocking position, the pushing part pushes a first side wall of the pushing slot; and when the lever actuates the crossbar to move from the designated unlocking position to the designated locking position, the pushing part pushes a second side wall of the pushing slot.

* * * * *